(12) United States Patent
Barsoum et al.

(10) Patent No.: US 6,175,316 B1
(45) Date of Patent: Jan. 16, 2001

(54) BIN-TO-BIN DIFFERENTIAL ENCODING APPARATUS AND METHOD FOR A DISCRETE MULTI-TONE TRANSMISSION SYSTEM

(75) Inventors: Maged F. Barsoum, Sunnyvale; Hungming Chang, Cupertino; Eugen Gershon, San Jose; Chien-Meen Hwang, San Jose; Muoi V. Huynh, San Jose, all of CA (US)

(73) Assignee: Legerity, Austin, TX (US)

( * ) Notice: Under 35 U.S.C. 154(b), the term of this patent shall be extended for 0 days.

(21) Appl. No.: 09/287,263

(22) Filed: Apr. 7, 1999

(51) Int. Cl.$^7$ ................................................. H03M 5/10
(52) U.S. Cl. ................................................. 341/54
(58) Field of Search ................................................. 341/54

(56) References Cited

U.S. PATENT DOCUMENTS

| | | | |
|---|---|---|---|
| 5,201,071 | * 4/1993 | Webb | 455/101 |
| 5,313,493 | * 5/1994 | Dutta | 375/56 |
| 5,908,463 | * 6/1999 | Johnson et al. | 375/220 |
| 6,075,795 | * 6/2000 | Barsoum et al. | 370/445 |

* cited by examiner

Primary Examiner—Howard L. Williams
(74) Attorney, Agent, or Firm—McDermott, Will & Emery

(57) ABSTRACT

A discrete multi-tone communication system employing bin-to-bin differential encoding of data frames to be transmitted within the communication system. The bin-to-bin differential encoding utilizes the phase angle of previously encoded data to encode the current data relative to that phase angle. Hence, only a single reference tone is required to encode a first portion of the data frame into a discrete tone, and then the remaining data portions of the data frame are each subsequently encoded into discrete tones with reference to the phase angle of data already encoded into a discrete tone. Thus, to achieve decoding, a decoding device only requires the reference tone to begin decoding the discrete tones to the correct phase angle for an accurate reproduction of the original data frame.

31 Claims, 6 Drawing Sheets

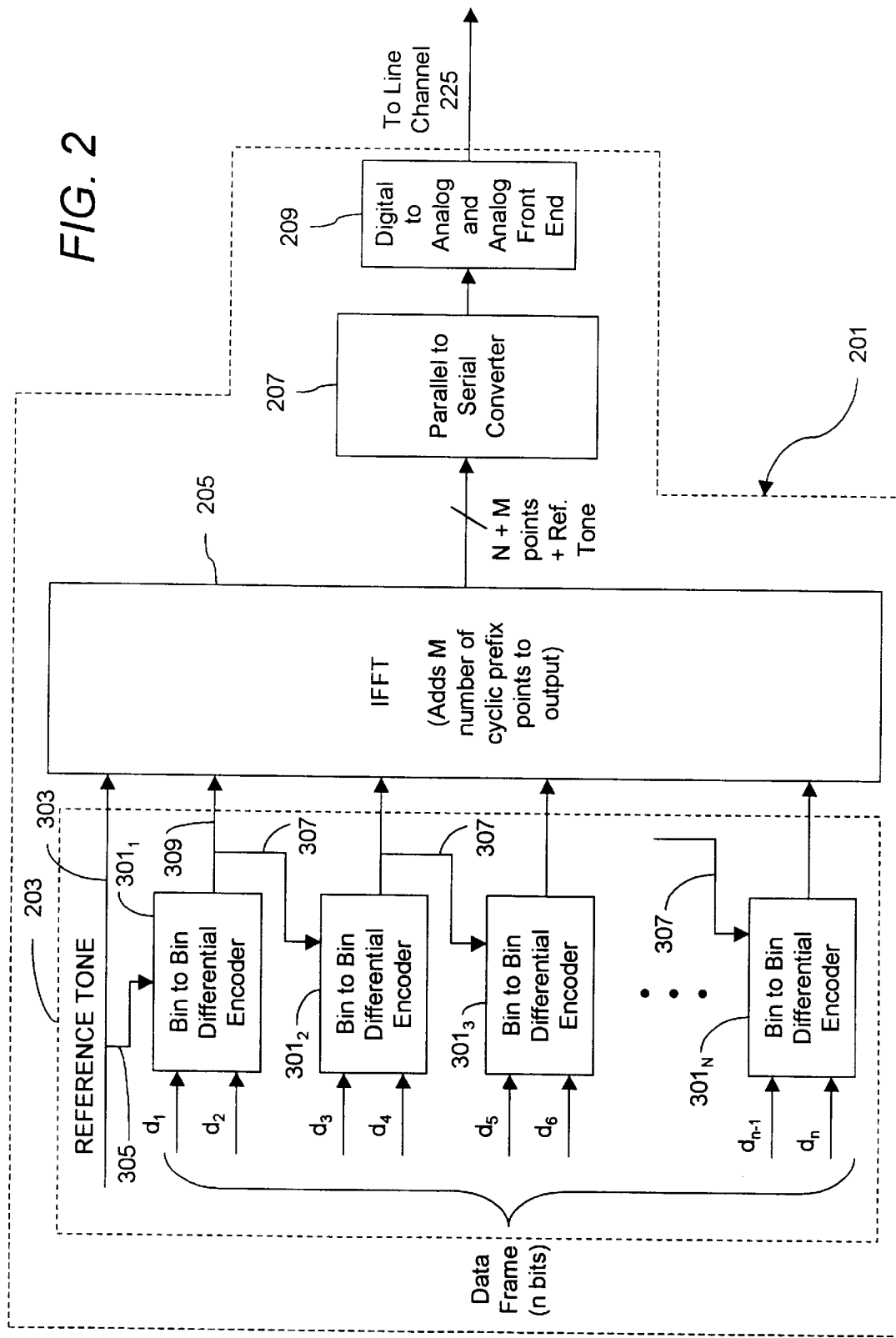

BIN-TO-BIN DIFFERENTIAL ENCODING APPARATUS AND METHOD FOR A DISCRETE MULTI-TONE TRANSMISSION SYSTEM

FIELD OF THE INVENTION

The present invention relates to encoding data in a discrete multi-tone (DMT) data communications network, particularly a network for communications between multiple devices coupled to existing wiring, for example twisted pair telephone wiring in a user's residence.

DESCRIPTION OF THE RELATED ART

Modern society continues to create increasing demands for digital information and the communication of such information between data devices. Local area networks use a network, cable or other media to link stations on the network for exchange of information in the form of packets of digital data. Typical local area network architecture uses a media access control (MAC) enabling network interface cards at each station to share access to the media. Most conventional local area network architectures use media access controllers operating according to half-duplex or full-duplex Ethernet (ANSI/IEEE standard 802.3) protocol and a prescribed network medium, such as twisted pair cable.

These architectures have proven quite successful in providing data communications in commercial applications. However, these common local area network architectures require installation of specialized wiring and use specific wiring topologies. For example, the most popular network protocols, such as Ethernet, require special rules for the wiring, for example with regard to quality of wire, range of transmission and termination.

Due to the success of the Internet and the rapid decreases in the prices of personal computers and associated data equipment, a demand has arisen for data communications between a limited number of devices within relatively small premises, typically a residence or small business. While existing local area networks can serve the purpose, in such installations, the cost of installing physical network wiring satisfying the rules for the particular protocol can be prohibitively expensive.

Most existing buildings, including residences, include some existing wiring, for telephones, electrical power and the like. Proposals have been made to communicate data using such existing infrastructure. This reduces the costs of wiring for the network, but the existing wiring raises a variety of issues regarding transport of high-speed digital signals.

For example, efforts are underway to develop an architecture that enables computers to be linked together using conventional twisted pair telephone lines. Such an arrangement, referred to herein as a home network environment, provides the advantage that existing telephone wiring in a home may be used to implement a home network environment without incurring costs for substantial new wiring installation. However, any such network must deal with issues relating to the specific nature of in-home telephone wiring, such as operation over a media shared with other services without interference from or interfering with the other services, irregular topology, and noise. With respect to the noise issue, every device on the telephone line may be a thermal noise source, and the wiring may act much like an antenna to pick up disruptive radio signal noise. Telephone lines are inherently noisy due to extraneous noise caused by electrical devices in the home, for example dimmer switches, transformers of home appliances, etc. In addition, the twisted pair telephone lines suffer from turn-on transients due to on-hook and off-hook and noise pulses from the standard telephones coupled to the lines, and electrical systems such as heating and air conditioning systems, etc.

An additional problem in telephone wiring networks is that the signal condition (i.e., shape) of a transmitted waveform depends largely on the wiring topology. Numerous branch connections in the twisted pair telephone line medium, as well as the different associated lengths of the branch connections, may cause multiple signal reflections on a transmitted network signal. Telephone wiring topology may cause the network signal from one network station to have a peak-to-peak voltage on the order of 10 to 20 millivolts, whereas network signals from another network station may have a value on the order of one to two volts. Hence, the amplitude and shape of a received pulse may be so distorted that recovery of a transmit clock or transmit data from the received pulse becomes substantially difficult.

At the same time, a number of XDSL technologies are being developed and are in early stages of deployment, for providing substantially higher rates of data communication over twisted pair telephone wiring of the telephone network. XDSL here is used as a generic term for a group of higher-rate digital subscriber line communication schemes capable of utilizing twisted pair wiring from an office or other terminal node of a telephone network to the subscriber premises. Examples under various stages of development include ADSL (Asymmetrical Digital Subscriber Line), HDSL (High data rate Digital Subscriber Line) and VDSL (Very high data rate Digital Subscriber Line).

Consider ADSL as a representative example. For an ADSL based service, the user's telephone network carrier installs one ADSL modem unit at the network end of the user's existing twisted-pair copper telephone wiring. Typically, this modem is installed in the serving central office or in the remote terminal of a digital loop carrier system. The user obtains a compatible ADSL modem and connects that modem to the customer premises end of the telephone wiring. The user's computer connects to the modem. The central office modem is sometimes referred to as an ADSL Terminal Unit—Central Office or 'ATU-C'. The customer premises modem is sometimes referred to as an ADSL Terminal Unit—Remote or 'ATU-R'. The ADSL user's normal telephone equipment also connects to the line through a frequency combiner/splitter, which is incorporated in the ATU-R. The normal telephone signals are split off at both ends of the line and processed in the normal manner.

For digital data communication purposes, the ATU-C and ATU-R modem units create at least two logical channels in the frequency spectrum above that used for the normal telephone traffic. One of these channels is a medium speed duplex channel; the other is a high-speed downstream only channel. Two techniques are under development for dividing the usable bandwidth of the telephone line to provide these channels. One approach uses Echo Cancellation. Currently, the most common approach is to divide the usable bandwidth of a twisted wire pair telephone line by frequency, that is to say by Frequency Division Multiplexing (FDM).

FDM uses one frequency band for upstream data and another frequency band for downstream data. The downstream path is then divided by time division multiplexing into one or more high-speed channels and one or more low speed channels. The upstream path also may be time-division multiplexed into corresponding low speed channels.

The FDM data transport for ADSL services utilizes discrete multi-tone (DMT) technology. A DMT signal is basically the sum of N independently QAM modulated signals, each carried over a distinct carrier frequency channel. The frequency separation between consecutive carriers is 4.3125 kHz with a total number of 256 carriers or tones (ANSI). An asymmetrical implementation of this 256 tone-carrier DMT coding scheme might use tones 32–255 to provide a downstream channel of approximately 1 MHz analog bandwidth. In such an implementation, tones 8–31 are used as carriers to provide an upstream channel of approximately 100 kHz analog bandwidth. Each tone is quadrature amplitude modulated (QAM) to carry up to 15 bits of data on each cycle of the tone waveform (symbol).

FIG. 8 illustrates a block diagram of a basic DMT system known in the art. A bit stream is first input to a constellation mapper 3 within the Transmitter 1. Within the constellation mapper 3, the bit stream is organized into groups of bits, each group assigned to a corresponding tone or "frequency bin". The constellation mapper 3 serves to encode or "map" the bits according to a QAM protocol by representing each grouping of bits with a respective discrete tone. Specifically, each grouping of bits assigned to each corresponding tone is represented by a complex number (i.e., a "constellation point") containing an amplitude and phase of that particular tone. As an example, FIG. 9 illustrates a constellation point 20 located in a plane of real and imaginary values having an amplitude of one and phase angle of 45 degrees (e.g., the complex number $1/\sqrt{2}+1/\sqrt{2}j$) that has been arbitrarily chosen to represent the two bit grouping 00.

All of the complex numbers of every tone output from the constellation mapper 3 are then fed into an Inverse Fast Fourier Transform (IFFT) 5. The IFFT converts the tones, which are in the frequency-domain, into time-domain waveforms. Additionally, a guard band called a "cyclic-prefix" is also included in the output of the IFFT 5 to eliminate the effects of Inter Symbol Interference (ISI). As shown in FIG. 8, the output signal of the IFFT 5 is input to a parallel-to-serial block 7 that sequentially outputs the signal into a Digital to Analog (D/A) converter and analog front end (AFE) 9 for transmission over the channel 25.

When the signal is received at the receiver 11, an AFE 13 converts the analog signal back to digital and feeds the result to an input serial-to-parallel block 15. Before delivering the signal to the Fast Fourier Transform 17, the cyclic-prefix is removed from the signal. The FFT 17 transforms the signal from a time-domain based signal into a frequency-domain signal containing the amplitude and phase information (i.e., the constellation point) for each tone. However, due to attenuation and phase distortion that invariably occurs when transmitting over channel 25, the result from the FFT 17 no longer matches the originally transmitted phase and amplitude. Hence, a Frequency Domain Equalizer (FEQ) 19, as shown, is utilized to reverse the effects of amplitude and phase distortion. In addition, other systems also use a Time Domain Equalizer (TEQ) to reverse the effects of amplitude and phase distortion. Coefficients utilized by a FEQ or TEQ are normally obtained through the ADSL standard data packet-by-data packet training sequence between the transmitter 1 and the receiver 11. After correcting the amplitude and phase, each tone is sliced by a slicer 21 into the closest constellation point and demapped back to the original bit stream.

Existing ADSL systems provide effective high-speed data communications over twisted pair wiring between customer premises and corresponding network-side units, for example located at a central office of the telephone network. However, existing ADSL units are not suitable for providing local area network type communications within a customer's premises, for example. That is, the channel characteristics within environments such as customers'0 premises are difficult to predict given a number of variables not existent in typical installations of ADSL. Further, as discussed above, existing ADSL units require data packet-by-data packet training that is complex and inefficient.

Another problem is that networking, especially within a residence, often requires multi-point transmission, whereas ADSL units are designed for point-to-point communication. In addition, currently existing ADSL modems tend to be quite complex and, therefore, prohibitively expensive for in-home communications between multiple data devices of one customer. Furthermore, due to different channel characteristics mentioned above, the coefficient settings of the FEQ 19 in the conventional DMT system may be different between any two nodes in the network. Hence, data packet-by-data packet training for finding the coefficient becomes preferable to maintain signal integrity. However, in a packet-switched network such as Ethernet, the training sequence attached on each packet is typically impractical due to its large overhead.

A need therefore still exists for techniques to adapt DMT type DSL communications for use over existing in-home wiring. The adaptations should enable multi-point communications. In addition, many of the problems overcome by complex methodologies in ADSL communications need corresponding simpler, more cost effective solutions for in-home networking. For example, the encoding and decoding of the tone signals should not require a complex training sequence as required by the equalizers of the typical DMT scheme to reverse the effects of signal attenuation and phase distortion in the channel.

SUMMARY OF THE INVENTION

These and other needs are attained by the present invention by providing an improved encoding technique at the physical layer for use in a multi-point DMT communication system. Specifically, the present invention employs bin-to-bin differential encoding that encodes data frames into discrete tone values. The phase angle of each of the discrete tone values is encoded relative to a preceding tone within the symbol, for example a tone at an adjacent frequency band. Additionally, the phase angle of the first tone is encoded with reference to a single reference tone that is included with all the encoded tones comprising the symbol.

Further, a decoding scheme is employed that receives and decodes the symbol. Decoding is effected by rotating the phase angle of each tone within the symbol with respect to the previous tone value also within the symbol. In addition, the first tone is decoded by rotating the phase angle of the tone with respect to the reference tone.

Thus, one aspect of the present invention relates to a network system having a transmitter that receives a first data bit stream of binary values. The transmitter then differentially encodes the data bit stream relative to a reference tone into a plurality of discrete tones according to a predetermined encoding protocol. The transmitter transmits the plurality of discrete tones and the reference tone over a transmission medium. In turn, a receiver receives the plurality of discrete tones and the reference tone from the transmission medium, decodes each of the plurality of discrete tones by rotating the phase of each discrete tone based on one of the received reference tone and an adjacent tone, and determines a corresponding binary value for each the decoded tones according to a predetermined decoding protocol. The receiver then outputs the binary values as a second data bit stream.

Another aspect of the present invention relate to a method of transmitting and receiving data in a network system first receiving a data symbol comprised of a plurality of bits. A reference tone value is generated and the plurality of bits is divided into a plurality of bit groupings. Each bit grouping is then encoded as a current tone having a phase angle amount set relative to either the reference tone value or another adjacent encoded current tone valued dependent on whether or the bit grouping is the first grouping to be encoded. The current tone value for each of the bit groupings is then transmitted over a network medium to a receiving node of the network system. The receiving node receives the current tone value for each of the bit groupings and rotates the phase angle of the current tone value relative to one of the reference tone and another current tone value for each of the bit groupings by the phase angle amount to establish a corrected tone value for each of the received current tone values. Next, the universe of possible tone values is divided into a plurality of equal predetermined regions. Each of the corrected tone values is then decoded by determining within which of the plurality of equal predetermined regions does the respective corrected values lie. Accordingly, the receiving node outputs a specific bit grouping value selected according to a predetermined correspondence between the plurality of equal predetermined regions and respective bit grouping values; and reconstructs the data symbol by assembling the outputted specific bit grouping values.

Still another aspect of the invention includes a method for encoding data for transmission on a shared network medium in a random access multipoint network, wherein a tone is transmitted on the shared network medium and is modulated based on a corresponding reference tone having a first position in a complex plane. A group of bits is then encoded into a current tone value having a second value in the complex plane based on the first position and a value of the group of bits. The tone is modulated and transmitted on the shared network medium based on the second tone consecutively following the first tone.

Bin-to-bin differential encoding and decoding employed by the present invention eliminates the need for complex and inefficient data packet-by-data packet training typically used in prior DMT systems by eliminating the need for FEQ's and TEQ's. Additionally, in installations having irregular topologies, the described embodiment affords installation adaptability since a first data tone within a symbol is encoded with reference to a single reference tone and the remaining data tones are, in turn, each encoded with reference to a data tone of a neighboring frequency starting with the first data tone, with the single reference tone being encoded as part of the symbol. Despite that both the data tones and reference tone are subject to amplitude and phase distortion, since they are transmitted together as a single symbol, the neighboring tones within the symbol are subject to essentially the same distortion. Hence, the bin-to-bin differentially encoded data may be accurately decoded because the phase angle differences between the neighboring tones, essential to decoding, remain essentially constant.

Additional advantages and novel features of the invention will be set forth in part in the description which follows, and in part will become apparent to those skilled in the art upon examination of the following or may be learned by practice of the invention. The advantages and features of the invention may be realized and attained by means of the instrumentalities and combinations particularly pointed out in the appended claims.

BRIEF DESCRIPTION OF THE DRAWINGS

FIG. 2 illustrates a detailed block diagram of the transmitter portion of the DMT network system of FIG. 1.

DETAILED DESCRIPTION OF THE PREFERRED EMBODIMENTS

The present invention relates to providing bin-to-bin encoding in a DMT network system to provide accurate encoding and decoding without the need for complex and high overhead training schemes. However, it will become apparent that the invention may also be utilized in other communication systems as well.

Figure 1:
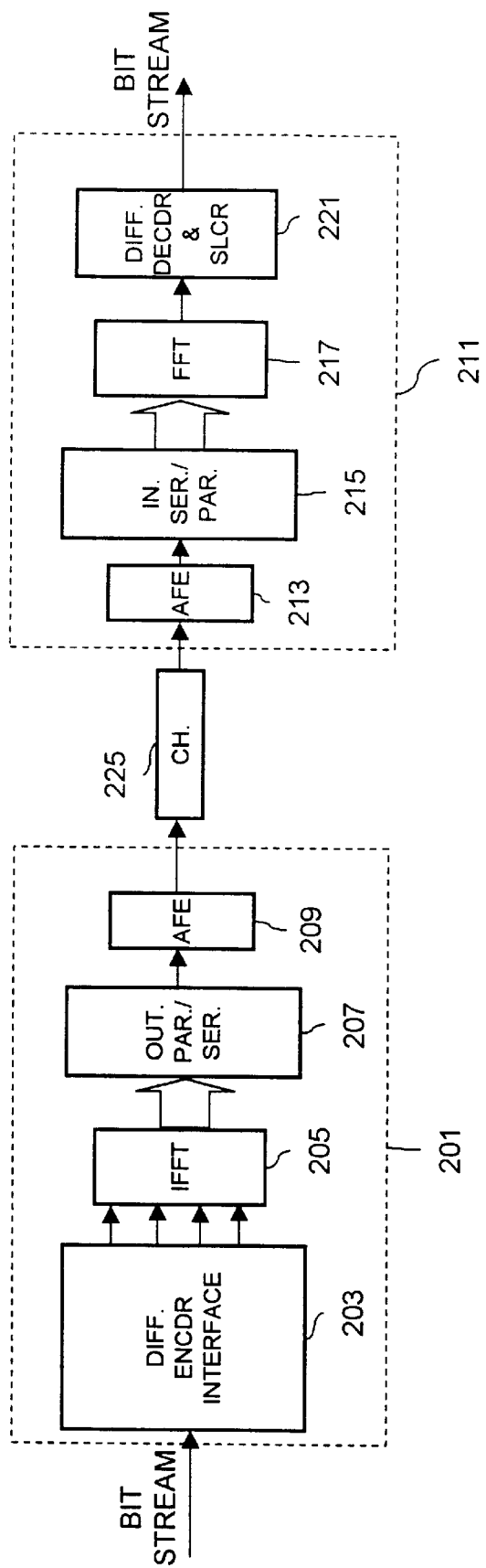
FIG. 1 illustrates a block diagram of the overall DMT network system.

FIG. 1 illustrates an exemplary embodiment of the present DMT network system. A transmitter 201 receives a binary bit stream of data from a network node, encodes the data into a number of discrete tones, and transmits those tones to a network channel medium 225. On the receiving end of the transmission, a receiver 211 decodes the encoded tones back to binary bit stream data for use by another network node.

In particular, a differential encoder interface 203 receives a data frame of a prescribed "n" number of bits. In a preferred embodiment, the prescribed "n" number of bits per frame is 512, selected based upon the physical limitations of the channel medium 225. The differential encoder interface 203 separates the bits into groupings of data bits, preferably groups of two bits. Each grouped pair of data bits is then encoded using a differential encoder that encodes the bits into a discrete tone having a specific phase angle and amplitude determined based upon the binary value of the bits, described below. Using two bit encoders, a n/2 number of encoders are required to encode an n number of bits. In the preferred embodiment, 256 encoders are provided within the differential encoder interface 203 to output 256 tones representing the 512 input data bits. Thus, the transmitter will transmit at least 256 discrete tones or "bins" to be carried over channel 225. Typically, each tone is given a bandwidth of 4.3125 kHz. Hence, the total analog bandwidth will be in excess of 1.1 MHz.

FIG. 2 illustrates in more detail the transmitter portion 201 of the present system, especially the encoding portion of the transmitter. In particular, the differential encoder interface 203 includes a n/2 number of "bin-to-bin" differential encoders ($301_1$ to $301_{n/2}$). Pairs of data bits (e.g., $d_1$ and $d_2$), totaling the "n" number of binary bits in the data frame, are input to each encoder 301. In addition, a reference tone generator (not shown) provides a reference tone signal 303 to the first bin-to-bin differential encoder $301_1$ and to the Inverse Fast Fourier Transform 205 for frequency to time domain transformation and inclusion as part of the "symbol" to be transmitted over the line channel 225.

The term "bin-to-bin" refers to a methodology in which a particular differential encoder 301 receives a previously encoded tone at an adjacent or neighboring frequency band (i.e., a tone from another differential encoder 301 adjacent to the particular encoder 301 presently encoding, having sufficiently close frequency such that the distortion characteristics are substantially the same) and uses this adjacent or neighboring encoded tone as a point of reference from which a difference signal is established between the adjacent or neighboring encoded tone and the tone of a constellation point predetermined for the particular data bit sequence presently being encoded. In other words, in "bin-to-bin" encoding, the phase angle of an adjacent or neighboring "bin" or tone output from an adjacent or neighboring encoder that has completed encoding (e.g., $301_2$) is, in turn, utilized by an encoder presently encoding data (e.g., $301_3$). The encoder presently encoding data (e.g., $301_3$) uses the phase angle of the adjacent or neighboring "bin" as the starting or reference angle from which the phase angle of the present encoded tone is advanced by the difference in phase angles between the adjacent or neighboring tone and the tone of the predetermined constellation point of the presently being encoded.

As shown in FIG. 2, an implementation of the preferred embodiment employs a plurality of physical connections 307 connecting the outputs of each of the encoders $301_1$ to $301_{n/2-1}$ to an input in each next adjacent differential encoder (i.e., $301_2$ to $301_{n/2}$). It will be appreciated by those skilled in the art, however, that other implementations using an output of a previous neighboring, non-adjacent differential encoder could also be employed to achieve bin-to-bin differential encoding in the present invention. In addition, differences between amplitudes of the tones or both amplitude and phase could also be utilized, instead of only differences between the phase angles, for example.

With respect to the first encoder $301_1$, the reference tone 303, as mentioned above, is utilized by the first encoder $301_1$ via connection 305 to establish the difference of phase angle rotation of the first encoded tone 309. Hence, the reference tone is the first reference point or starting point from which all subsequent encoding is ultimately referenced. That is, the angle of the reference tone 303 is the starting point for the first encoder encoding data, whose output provides, in turn, the angle from which the second encoder encodes data, and so forth.

Figure 3:
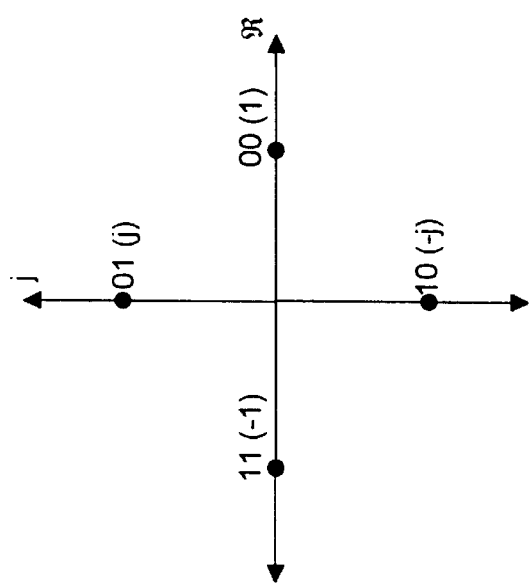
FIG. 3 illustrates a graph of the constellation of tones used for encoding two bits of data according to an embodiment of the invention.

As an example of bin-to-bin encoding, FIG. 3 illustrates a constellation map on a Cartesian graph having the x-axis representing the set of all real numbers (represented by ℜ) and the y-axis representing the set of all imaginary numbers (represented by j) for a two bit encoding scheme. As shown, each of the total of four possible binary numbers are assigned one of four predetermined complex number values corresponding to four possible tones. For example, binary value 00 is represented by a tone of +0j (or simply 1) corresponding to an angle of zero degrees (selecting the positive x-axis as 0 degrees), binary value 01 is represented by a tone of 0+j (or simply j) at an angle 90 degrees, binary value 11 is represented by a tone of −1 at an angle of 180 degrees, and so forth. Hence, when a binary value is received by a bin-to-bin differential encoder, the encoder "translates" this value to a complex number value representing a preliminary tone according to this predetermined binary value-to-tone correspondence. The differential encoder then establishes the encoded value by multiplying the preliminary tone value corresponding to the original binary value by a tone value from a tone at an adjacent or neighboring frequency to establish a current tone value having a phase angle advanced from the angle of the adjacent or neighboring tone value by the number of degrees of the tone value corresponding to the binary value. In other words, the phase angle of the adjacent tone is advanced by the degree amount (i.e., a differential amount) of the bit-to-tone correspondence tone value. Hence, each current tone value is referenced to an adjacent or neighboring tone value, thus obviating the need for each encoded tone to be referenced to a respective extrinsic reference value. The bin-to-bin differential encoding scheme of the present embodiment simply needs only one reference tone (e.g., 303 in FIG. 2) to achieve subsequent differential encoding of all 256 tones into a symbol for transmission.

Figure 4:
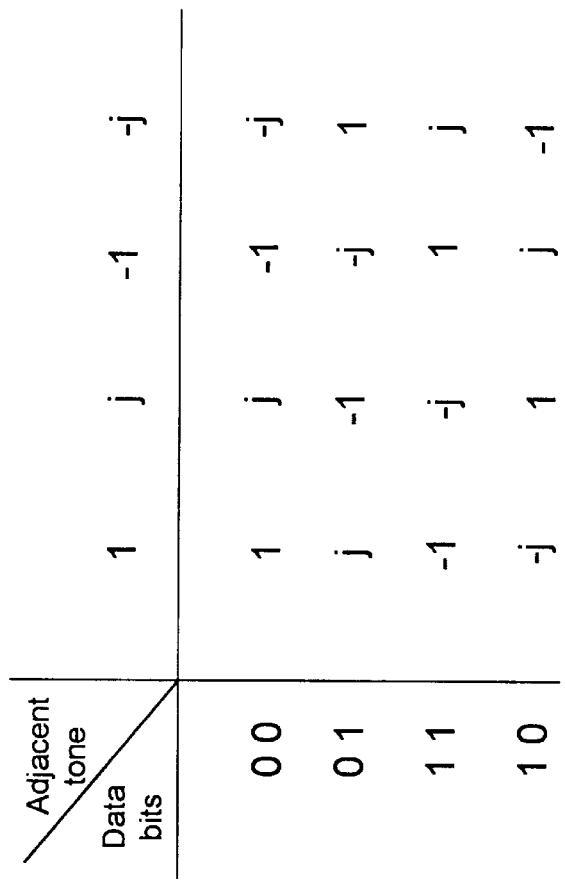
FIG. 4 shows a table of current tone values assigned for specific data bit combinations based on bin-to-bin differential encoding based upon the adjacent or neighboring tone as a reference.

FIG. 4 is a table illustrating the current tone values that will be output by the preferred embodiment from any given bin-to-bin differential encoder based upon the input adjacent or neighboring tone value from the preceding differential encoder and the binary value of the data bits input to the differential encoder for encoding. As one skilled in the art will recognize, the current tone values in this table represent the product of the adjacent or neighboring tone value and the corresponding complex number tone corresponding to the data bits presented as discussed above and illustrated in the constellation of FIG. 3. However, it will also be appreciated by those skilled in the art that that the bin-to-bin differential encoding scheme may be extended to constellations having more than four points per tone and constellations point having either the same amplitude or different amplitudes.

Once encoding has been accomplished by differential encoding interface 203, each of the encoded tones, plus the reference tone, are input to the IFFT 205. In the preferred embodiment, the IFFT performs two functions. First, the IFFT 205 transforms the encoded tones from frequency-domain signals to time-domain signals and assembles them as a "symbol" in preparation for transmission over line channel 225 and outputs a corresponding N number of samples. In addition, the IFFT 205 adds an M number of cyclic-prefix samples to its output to avoid Inter-symbol Interference (ISI) and allowing tolerance for timing recovery. In the preferred embodiment, these M cyclic-prefix points are a repeat of the first 32 of the n/2 number of tones. The N+M samples are then buffered in the parallel to serial converter 207. The converter 207, in turn, transmits the points serially to the Analog Front End (AFE) 209 which converts the incoming serial digital signals to analog signals and transmits the signals over line channel 225.

Figure 5:
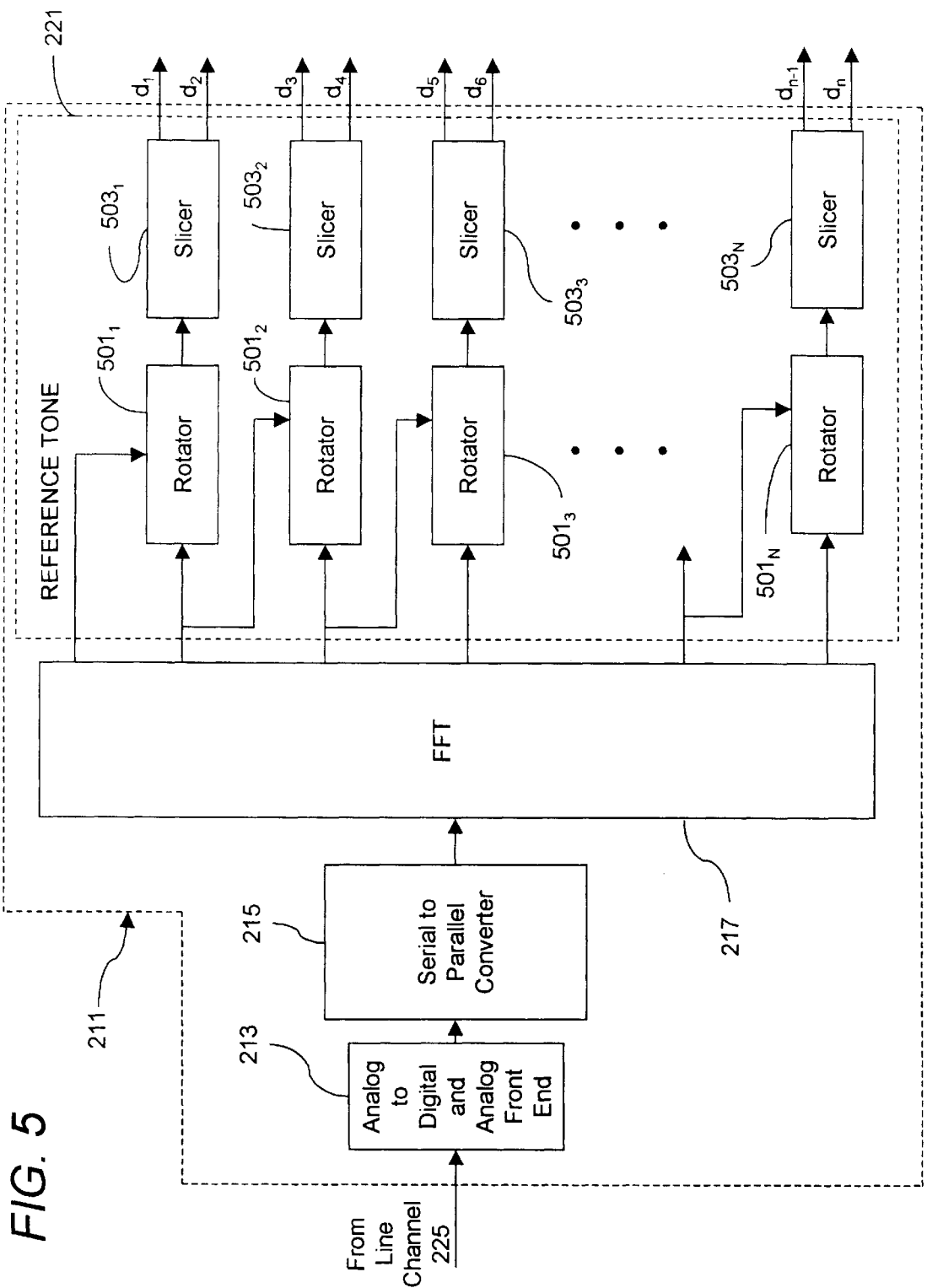
FIG. 5 illustrates a detailed block diagram of the receiver portion of the DMT network system of FIG. 1.

At the receiver 211, shown in FIGS. 1 and 5, the transmitted serial signals are received from line channel 225 by an AFE 213 that converts the incoming analog signals to digital signals. The Serial to Parallel converter 215 buffers the incoming serial digital signals received from AFE 213 and outputs a parallel signal once all N+M samples are received by a Fourier Fast Transform 217(FFT). FFT 217 converts the time-domain signals back to the frequency domain and serves to drop the M number (e.g., 32) of cyclic-prefix samples. Thus, FFT 217 only outputs the N samples from which the n/2 tones and the reference tone are recovered.

Typically, transmission over a line channel 225 distorts the amplitude and phase of the transmitted signal. Hence, the tone signals delivered to the differential decoder 221 are most likely no longer the correct phase and amplitude. Hence, the differential decoder must recover the data despite the distortions that may occur during transmission. To this end, the differential decoder of the preferred embodiment includes a plurality of rotators ($501_1$ to $501_{n/2}$) that rotate the tone signal to the correct phase angle necessary for accurate decoding back to the original binary bit values. In addition, it can be appreciated to those skilled in the art that the differential decoder could include further decoding devices, such as "scalers", in alternate embodiments that encode tones based on their amplitude or both their phase and amplitude.

Each rotator in the preferred embodiment performs a mathematical calculation that is essentially the inverse of the mathematical calculation performed by the corresponding bin-to-bin differential encoder 301 in the transmitter 201, utilizing the phenomenon that despite the distortion of the phase angles due to transmission over the channel 225, the phase difference between the adjacent or neighboring tones remains essentially constant. Thus, since the tones were originally differentially phase encoded with reference to an adjacent or neighboring tone value, the essentially constant phase difference between the adjacent or neighboring tones can be used to restore the original phase angles.

Figure 6:
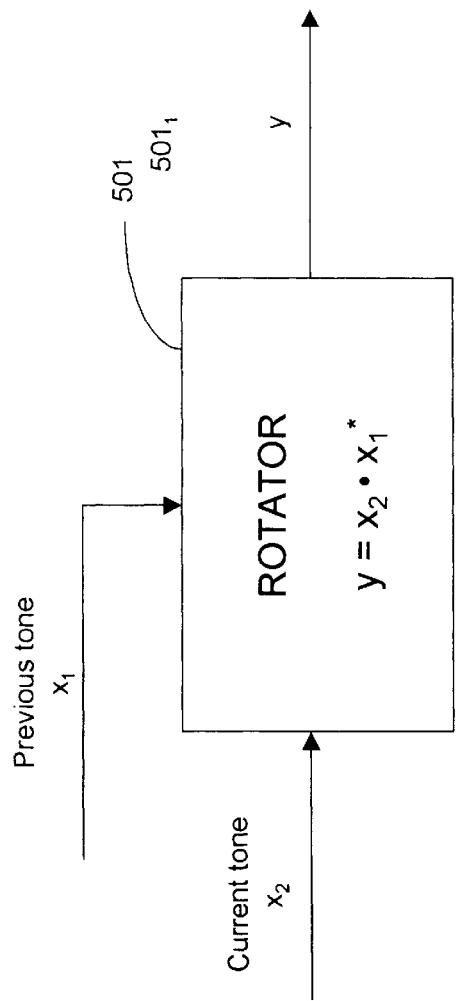
FIG. 6 illustrates the configuration of the phase rotator shown in the block diagram of FIG. 5.

A representative rotator 501 is illustrated in FIG. 6. As shown, the rotator 501 has two inputs. A first input 601 delivers the current tone value to be decoded, represented by the variable $x_2$, to the rotator 503 from the FFT 217. A second input 603 delivers the adjacent or neighboring tone value, represented by the variable $x_1$, that was delivered to the adjacent or neighboring adjacent rotator (e.g., $501_2$ if the current tone is being delivered to rotator $501_3$) for encoding. The rotator then multiplies the current tone value $x_2$ the conjugate of the adjacent or neighboring tone $x_1$ (i.e., $x^*$) to achieve a resultant value y. Multiplying the current tone value by the conjugate of the adjacent or neighboring tone value essentially reverses the calculation initially performed by the encoder to differentially encode the original tone value based on phase angle difference (Note: a more complex and different calculation would be required, however, in embodiments contemplating encoding based on amplitude or scale difference). Thus, since the relationship between the phase angles of the current and adjacent or neighboring tone (or the reference tone) remains constant despite the change in values due to distortion, this necessarily implies that the resultant product y of the division of the current tone by the adjacent or neighboring tone (i.e., the multiplication of the current tone by the conjugate of the adjacent or neighboring tone) will have the same phase angle as the original tone had prior to encoding. It will be appreciated by those skilled in the art, however, that alternate embodiments could include determining the encoded phase difference by different operations than that described above (i.e., without performing the described multiplication) to rotate the tone by the appropriate phase angle. For example, an alternate logic could simply recover the correct original phase and amplitude of the tone using the known phase angle difference and the starting phase angle of the reference tone.

Figure 7:
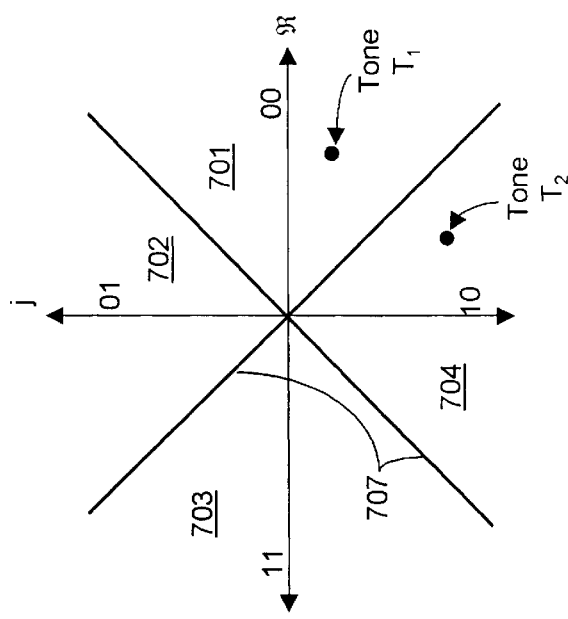
FIG. 7 illustrates an exemplary slicing of the constellation map as determined by the slicer shown in FIG. 5.
Figure 8:
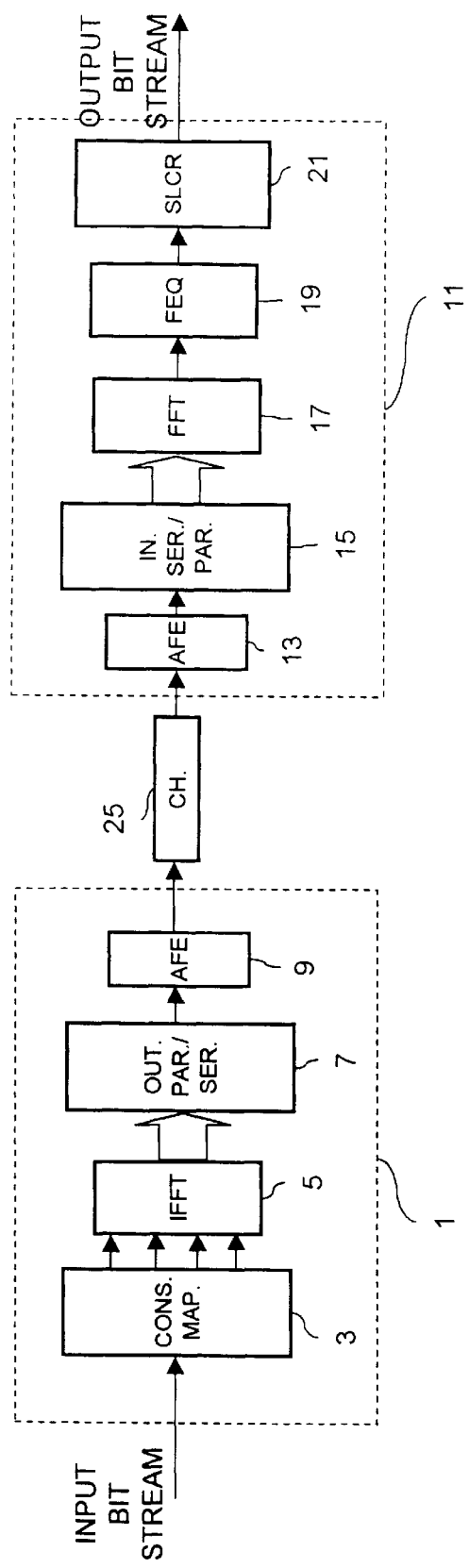
FIG. 8 illustrates a block diagram of a DMT network system according to the prior art.
Figure 9:
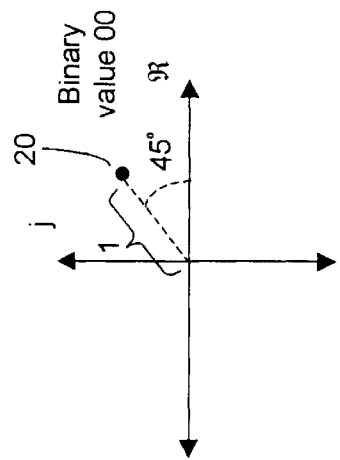
FIG. 9 illustrates a mapped point constellation for the DMT network system illustrated in FIG. 8.

Since, after transmission, the phase angles most likely will not occur exactly at the 0°, 90°, 180° or 270° angles, the encoding process requires a means to account for tones that occur at angles different than these. Thus, after each current tone has been rotated back to the original phase angles, each of the tones is sent to a respective slicer 505. Each slicer 505 divides the universe of potential tone values in the real-imaginary Cartesian plane into equal sections. As shown in FIG. 7, the preferred embodiment employs slicer 505 "slicing" the universe of tone values into four equal sections or regions (701–704) bounded by sides 707 occurring at 45 degree angles to both the ordinate and abscissa axes. Tones occurring inside a particular region are accorded the discrete binary values that that region contains. Hence, sliced region 701, containing a range and domain of tones 45 degrees to either side of 0 degrees, corresponds to a binary value of 00 for all tones falling within this region. Likewise, sliced region 702 containing a range and domain of tones 45 degrees to either side of 90 degrees correspond to a binary value of 01, region 703 encompassed tones accorded the binary value 11, and so forth.

As an example of how the slicer accords binary values, FIG. 7 illustrate a tone $T_1$ that falls at a point on the Cartesian plane having a positive real number component and a negative imaginary number component. The phase angle of tone $T_1$ is approximately 330 degrees. Since the point falls within region 701, the tone is accorded the binary bit value of 00. As another example, tone $T_2$ falls at a point on the Cartesian plane also having a positive real number component and a negative imaginary number component. However, since the phase angle of this tone is approximately 285 degrees, $T_2$ falls within region 704 and is accorded a value of 10. Thus, dependent upon the region within which the tone value y falls, the slicer accords each tone a binary bit value as the final step in the decoding process. The receiver then delivers a data bit stream identical to the original bit stream to a receiving network node (not shown) for use by that device.

As can be appreciated from the foregoing description, the described embodiment including bin-to-bin differential encoding and decoding eliminates the need for FEQ's and TEQ's typically used in prior DMT systems and their associated complex and inefficient data packet-by-data packet training. Additionally, in installations having irregular topologies, the described embodiment affords installation adaptability since a first data tone within a symbol is encoded with reference to a single reference tone and the remaining data tones are, in turn, each encoded with reference to a data tone of a neighboring frequency starting with the first data tone, with the single reference tone being encoded as part of the symbol. Despite that both the data tones and reference tone are subject to amplitude and phase distortion, since they are transmitted together as a single symbol, the neighboring tones within the symbol are subject to essentially the same distortion. Hence, the bin-to-bin differentially encoded data may be accurately decoded because the phase angle differences between the neighboring tones, essential to decoding, remain essentially constant.

While this invention has been described as what is presently considered to be the most practical preferred embodiments, it is to be understood that the invention is not limited to the disclosed embodiments, but, on the contrary, is intended to cover various modifications and equivalent arrangements included within the spirit and scope of the appended claims.

What is claimed is:

1. An apparatus for encoding data in a communication system comprising:
    an encoder configured for receiving a data frame comprised of a plurality of data bits and encoding the data frame into a plurality of encoded tones for transmission over a medium; and
    a transmitting device configured for receiving the plurality of encoded tones, assembling the plurality of encoded tones into a data symbol and transmitting the symbol over the medium to one or more receiving nodes;

the encoder having a plurality of differential encoding devices, each of the plurality of differential encoding devices configured to receive a data input comprised of a predetermined number of bits from the plurality of bits and output an encoded tone, and wherein each differential encoding device encodes the predetermined number of bits based on one of a reference tone and an encoded tone output from another one of the plurality of differential encoding devices, and outputs the encoded tone to the transmitting device.

2. The apparatus according to claim 1, wherein the predetermined number of bits is two.

3. The apparatus according to claim 1, further comprising:

each of the plurality of differential encoding devices respectively having an encoding tone input and a tone output; and the plurality of differential encoding devices connected such that the encoding tone input of a first encoding device receives the reference tone, and each of the encoding tone inputs of a remaining portion of the plurality of differential encoding devices are connected to the tone output of another one of the plurality of differential encoding devices.

4. The apparatus according to claim 3, wherein the encoding tone input of at least one of the plurality of differential encoding devices is connected to the tone output of a previously adjacent differential encoding device.

5. The apparatus according to claim 3, wherein the encoding tone input of a differential encoding devices is connected to the tone output of a nonadjacent neighboring differential encoding device.

6. An apparatus for decoding encoded data in a communication system, comprising:

an interface for receiving encoded data, and converting the encoded data into a plurality of separate tones;

a plurality of rotator devices, each rotator device having an encoded tone input configured to respectively receive a separate one of the plurality of separate tones, each rotator device configured to rotate the phase of each respectively received separate one of the plurality of separate tones based upon one of a reference tone and another one of the plurality of separate tones and to output a rotated tone comprised of a complex number; and a plurality of slicers, each of the plurality of slicers receiving a rotated tone output from a respective one of the plurality of rotator devices, wherein each slicer determines where the respective rotated tone lies in a real-imaginary Cartesian plane containing the universe of possible tone values, and outputs multiple bit data based on the determination.

7. The apparatus according to claim 6, further comprising:

each of the plurality of rotator devices respectively having a previous tone input; and the plurality of rotator devices connected such that the previous tone input of a first rotator device receives the reference tone, and each of the previous tone inputs of a remaining portion of the rotator devices are connected to a respective encoded tone input of another one of the plurality of rotator devices.

8. The apparatus of claim 7 wherein the rotator rotates the phase of the input tone by multiplying the respective separate one of the plurality of separate tones received by the encoded tone input by a conjugate of another one of the plurality of separate tones received by the previous tone input.

9. The apparatus according to claim 7, wherein the encoded tone input of a rotator device is connected to the previous tone input of a subsequently neighboring rotator device.

10. The apparatus according to claim 7, wherein the encoded tone input of a rotator device is connected to the previous tone input of a subsequently adjacent rotator device.

11. The apparatus according to claim 6, wherein each of the plurality of slicer divides the real-imaginary Cartesian plane into a plurality of regions each corresponding to a respective bit data value and selects a bit data value based on which one of the plurality of regions the respective rotated tone value lies.

12. The apparatus according to claim 11, wherein the plurality of regions are equal in area.

13. The apparatus according to claim 12, wherein the plurality of regions comprises four equal regions, each of the four regions corresponding to a multiple bit data value.

14. A communication system comprising:

a transmitter receiving a first data bit stream of binary values, differentially encoding the data bit stream relative to a reference tone into a plurality of discrete tones according to a predetermined encoding protocol, and transmitting the plurality of discrete tones and the reference tone over a transmission medium; and a receiver receiving the plurality of discrete tones and the reference tone from the transmission medium, decoding each of the plurality of discrete tones by determining at least one of an original phase angle and amplitude of each discrete tone based upon one of the received reference tone and an adjacent tone, determining a corresponding binary value for each the decoded tones according to a predetermined decoding protocol, and outputting the binary values as a second data bit stream.

15. The system of claim 14, wherein the transmitter differentially encodes the first data bit stream such that at least one of the phase and amplitude of each of the plurality of discrete tones is set relative to one of the reference tone and another one of the encoded tones.

16. The system of claim 15, wherein the another one of the encoded tones is a discrete tone encoded prior to a current discrete tone being differentially encoded.

17. The system of claim 14, wherein the receiver determines the original phase angle of each of the received discrete tones by rotating the phase of the each of tones by multiplying each discrete tone by the conjugate of one of the reference tone and another one of the received discrete tones.

18. A method of encoding binary data bits for transmission in a communication system comprising the steps of:

receiving a data frame comprised of a plurality of data bits;

providing a reference tone;

encoding a first grouping of bits from the plurality of data bits according to a predetermined protocol based upon at least one of a phase and amplitude of the reference tone to produce a first discrete tone;

encoding a second grouping of bits from the plurality of data bits according to the predetermined protocol based upon at least one of the phase and amplitude of the first tone to produce a second discrete tone;

encoding a plurality of bit groupings comprised from a remaining portion of the plurality of data bits according to the predetermined protocol based upon the at least one of the phase and amplitude of a previous tone of a previously encoded bit grouping to produce respective encoded discrete tones.

19. The method of claim 18 wherein the first tone, second tone and respective encoded tones are each comprised of a complex number representing the amplitude and phase of each respective tone.

20. The method of claim 18 wherein the first group of bits, the second group of bits and each of the plurality of bit groupings comprise two bits of data.

21. The method of claim 18 wherein each tone is comprised of one complex number from a group of four possible complex numbers.

22. The method of claim 18 wherein each tone is comprised of one complex number from a plurality of possible complex numbers.

23. A method of decoding a plurality of tones in a network system, the plurality of tones being received from a transmitting station that differentially encoded the tones relative to one another and a reference tone, comprising the steps of:

receiving the reference tone and the plurality of tones;

determining a phase angle of each of the plurality of tones with reference to one of a previous tone value and the reference tone and generating a respective corrected tone value for each of the plurality of tones based on the determination of the phase angle; and dividing the universe of possible tone values into a plurality of phase regions and determining a specific grouping of bits to be output for each corrected tone value dependent upon which of the plurality of phase regions each respective corrected tone value is located.

24. The method according to claim 23, wherein the steps of determining the phase angle and generating a respective corrected tone value of each of the plurality of tones includes the step of multiplying a value of each of the plurality of tones to be decoded by one of the conjugate value of the previous tone and the conjugate value of the reference tone.

25. The method according to claim 23, wherein the number of phase regions is four.

26. A method of transmitting and receiving data in a network system comprising the steps of:

receiving a data symbol comprised of a plurality of bits;

generating a reference tone value;

dividing the plurality of bits into a plurality of bit groupings;

encoding each bit grouping as a current tone having at least one of a phase angle and amplitude amount set relative to one of the reference tone value and another adjacent encoded current tone value;

transmitting the current tone value for each of the bit groupings over a network medium to a receiving node of the network system;

receiving the current tone value for each of the bit groupings at the receiving node;

determining the phase angle of the current tone value relative to one of the reference tone and another current tone value for each of the bit groupings by the phase angle amount and establishing a corrected tone value for each of the received current tone values based on the determined phase angle;

dividing the universe of possible tone values into a plurality of equal predetermined regions;

decoding each of the corrected tone values by determining within which of the plurality of equal predetermined regions the respective corrected values lie and outputting a specific bit grouping value selected according to a predetermined correspondence between the plurality of equal predetermined regions and respective bit grouping values; and reconstructing the data symbol by assembling the outputted specific bit grouping values.

27. The method of claim 26, wherein the bit groupings are comprised of two bits.

28. The method of claim 27, wherein the step of encoding the bit groupings includes determining a preliminary tone value based on a predetermined bit grouping-to-tone correspondence and multiplying the preliminary tone value by one of the reference tone value and the another previously encoded tone value.

29. The method of claim 26, wherein the steps of determining the phase angle and establishing the corrected tone value of the current tone value includes multiplying the current tone value by one of the conjugate of a previous tone value and the conjugate of the reference tone.

30. A method for encoding data for transmission on a shared network medium in a random access multipoint network, comprising:

transmitting on the shared network medium a tone modulated based on a corresponding reference tone having a first position in a complex plane;

encoding a group of bits into a current tone value having a second value in the complex plane based on the first position and a value of the group of bits;

modulating and transmitting the tone on the shared network medium based on the second tone consecutively following the first tone.

31. A random access multipoint network for transmission of data, comprising:

a shared network medium; and a plurality of network nodes, each comprising:
(1) a transmitter having a bin-to-bin differential encoder for encoding data into a first tone value having a first position in a complex plane based on a value of the data and a consecutively adjacent tone value having a corresponding preceding position in the complex plane, and
(2) a receiver for detecting a second tone having a second position in the complex plane and a third tone value, consecutively following the second tone value and having a third position in the complex plane, from a modulated tone having encountered at least one of amplitude and phase distortion on the shared network medium, the receiver recovering the data transmitted by the modulated tone on the third position relative to the second position.

* * * * *